United States Patent [19]
Epworth

[11] Patent Number: 5,828,689
[45] Date of Patent: Oct. 27, 1998

[54] ETALON ARRANGEMENT

[75] Inventor: Richard Edward Epworth, Sawbridgeworth, Great Britain

[73] Assignee: Northern Telecom Limited, Montreal Quebec, Canada

[21] Appl. No.: 848,337

[22] Filed: Apr. 30, 1997

[30] Foreign Application Priority Data

Jul. 20, 1996 [GB] United Kingdom .................. 9615302

[51] Int. Cl.$^6$ ...................................................... H01S 3/08

[52] U.S. Cl. .................................. 372/98; 372/32; 372/33

[58] Field of Search .................................. 372/98, 29, 32, 372/33

[56] References Cited

U.S. PATENT DOCUMENTS

5,173,908  12/1992  Negus et al. ............................... 372/98
5,559,816   9/1996  Basting et al. ............................. 372/98

Primary Examiner—Leon Scott, Jr.
Attorney, Agent, or Firm—John D. Crane; Kenneth W. Bolvin

[57] ABSTRACT

A control system for an etalon arrangement 4, in an optical transmission system involves applying a dither to a laser 1 upstream of the arrangement, monitoring the output of the arrangement, and using a control means 3 to lock the laser frequency to the etalon arrangement response, or vice versa. The control means operates on the basis of a ratio of derivatives of the monitored output with respect to wavelength, to enable locking to a point on the response curve, independent of power variations.

12 Claims, 6 Drawing Sheets

ETALON ARRANGEMENT

FIELD OF THE INVENTION

This invention relates to control systems for etalon arrangements to Fabry Perot dispersion compensators, to control systems for controlling the wavelength of a laser according to the output of an etalon arrangement, to methods of controlling etalon arrangements and to methods of transmitting data in an optical transmission system.

BACKGROUND

With the advent of optical amplifiers which can compensate for fibre loss, the reach of fibre systems at 10 Gb/s and beyond, is limited by chromatic dispersion. Chromatic dispersion causes different parts of the signal spectrum to arrive at the distant end of the system at different times. An optical signal carrying information has a finite bandwidth (spread in wavelengths). If these propagate at different velocities along the fibre, the narrow pulses will be dispersed. The dominant cause of chromatic dispersion is material dispersion, the variation in the refractive index versus wavelength of silica, the basic material from which all low loss transmission fibres are made.

Chromatic dispersion is a potentially reversible process, because the optical frequency of any part of the signal contains the information of the delay it has suffered. Optical dispersion compensation requires an element which can produce a delay versus frequency characteristic equal and opposite to that of the fibre. It may be optically compensated either by using special dispersion shifted transmission fibre in the transmission path or by localised dispersion compensation (equalisation).

One method of providing such compensation is to use an etalon. Such devices have a sharp response at resonant frequencies, which makes them suitable as filters. They also give a variable amount of dispersion, and so have been used as dispersion compensators. The Fabry Perot etalon is one example, which will be discussed in more detail.

Although a Fabry Perot etalon can be tuned across the full Erbium amplifier wavelength response window, it is a narrow band solution and one device can only compensate for the dispersion in a single specific wavelength channel. However it does offer low loss, small size and low cost. The particular advantage is that the compensation is easily adjustable by varying the tuning. This factor will become of greater importance in the future, as systems are required to operate over longer distances, and higher bit rates.

The main problem with the etalon dispersion compensator can be summarised as follows:

There is no reliable control system which will stabilise the dispersion over many years, despite any drift in device parameters which might occur (e.g. piezoelectric sensitivity, fibre input/output/monitor coupling efficiency monitor detector leakage current, or mirror finesse).

SUMMARY OF THE INVENTION

The invention aims to provide improved systems and methods.

According to one aspect of the invention, there is provided a control system for an etalon arrangement comprising a pair of reflecting surfaces arranged in parallel, at least one of which is partially reflecting, the system comprising: means for controlling the wavelength response of the arrangement; and monitoring means for monitoring the output of the arrangement; wherein the control means is operable on the basis of a ratio of derivatives with respect to wavelength, of the output.

According to another aspect of the invention there is provided a control system for controlling an output wavelength of a transmitter laser in an optical transmission system which comprises an etalon arrangement, downstream of the laser, the control system comprising: monitoring means for monitoring the output of the etalon arrangement; and control means for controlling the output wavelength of the laser on the basis of a ratio of derivatives with respect to wavelength, of the output.

According to another aspect of the invention, there is provided a Fabry Perot etalon dispersion compensator comprising: monitoring means for monitoring the output of the compensator, and control means to control the wavelength response of the compensator on the basis of the output of the monitoring means so as to maintain the dispersion of the compensator substantially independent of input power variations and characteristics of the monitoring means.

According to another aspect of the invention, there is provided a method of transmitting data in an optical transmission system comprising a source transmitter and an etalon arrangement, the method comprising the step of monitoring the output of the etalon arrangement, calculating a ratio of derivatives with respect to wavelength, of the monitored output, and controlling the output wavelength of the transmitter, or the wavelength response of the etalon arrangement, on the basis of the ratio.

According to another aspect of the invention, there is provided a method of controlling an etalon arrangement comprising a pair of reflecting surfaces arranged in parallel, at least one of which is partially reflecting, the method comprising the steps of:

controlling the wavelength response of the arrangement, and monitoring the output of the arrangement, wherein the controlling step is carried out at least on the basis of a ratio of derivatives with respect to wavelength, of the output.

Preferred features are set out in dependent claims. Such features may be combined in any manner as required.

BRIEF DESCRIPTION OF THE DRAWINGS

For a better understanding of the invention, and to show by way of example how the same may be carried into effect, embodiments of the invention will now be described, with reference to the drawings in which.

DETAILED DESCRIPTION

The basic Fabry-Perot etalon is an all pass device, i.e. varying the tuning varies the dispersion but not the power transmitted or reflected. It also has a multiplicity of very narrow resonances. One major uncertainty is whether the compensator can be locked to the correct operating point, reliably over life. In principle it would be possible to derive a control signal from the regenerator, by monitoring the eye shape. This is analogous to an autofocus camera which adjusts to maximum sharpness. This embodiment of the invention would be more difficult to implement with sufficient accuracy than the possibility of locking to the signal power, as will be described herein.

To implement the monitoring means, one way is to make the second mirror slightly transparent. The effect of this is to produce a small dip in the signal power (at the output port), as the etalon is tuned through resonance. While this alone could be monitored, a higher contrast signal is available by providing an additional monitor port, using the signal passing through the second mirror.

Similar high finesse etalons have been used for narrow band filters. These can be stabilised to the signal by applying dither to the etalon (via piezoelectric control elements), and feeding back to stabilise on the peak (by forcing the demodulated dither component to zero). For an etalon dispersion compensator, it has been necessary to provide an offset voltage in the control loop to enable locking to a point away from the peak. This technique requires a reference signal for the signal power, as without such reference, the operating point would vary rapidly with optical power level. One way of implementing this is to simply control to a fixed ratio of monitor to input (or output) power described as in U.S. Pat. No. 5,523,874, incorporated herein by reference. This however is reliant on the long term stability of the device. In the ideal situation the fibre coupling efficiencies and mirror reflectivities all stay constant, but this may not be the case in practice. There must be some questions of the stability of any bulk optic component. Accordingly, the invention provides a locking technique which uses the monitor, yet can stabilise the dispersion for a wide range of coupling and loss variations, and input powers.

Figure 1:
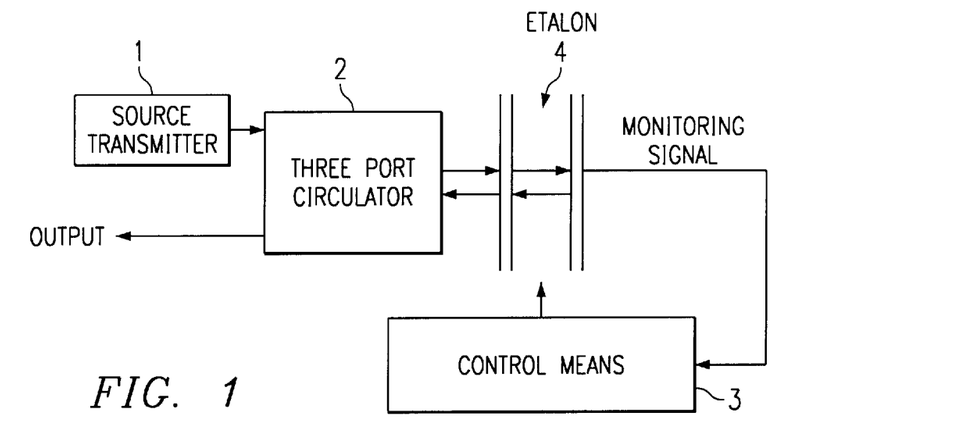
FIG. 1 shows a schematic diagram of an optical fibre transmission system incorporating features of the invention.

FIG. 1 shows an optical transmission system incorporating an embodiment of the control system of the invention. A source transmitter 1, for example a laser transmitter, feeds a three port circulator 2, which in turn feeds an etalon 4 controlled by a control means 3. The laser transmitter includes a modulation means, eg for direct modulation or external modulation.

The etalon 3 is shown as a reflective device, though the invention is applicable to transmissive devices. The three port circulator separates the output which can be fed to a receiver. The etalon or multiple etalon scan be located anywhere in the optical path.

A monitoring signal is derived from the etalon, preferably by making the reflecting face of the etalon slightly transmissive. This monitoring signal is fed back to the control means to facilitate locking.

Figure 2:
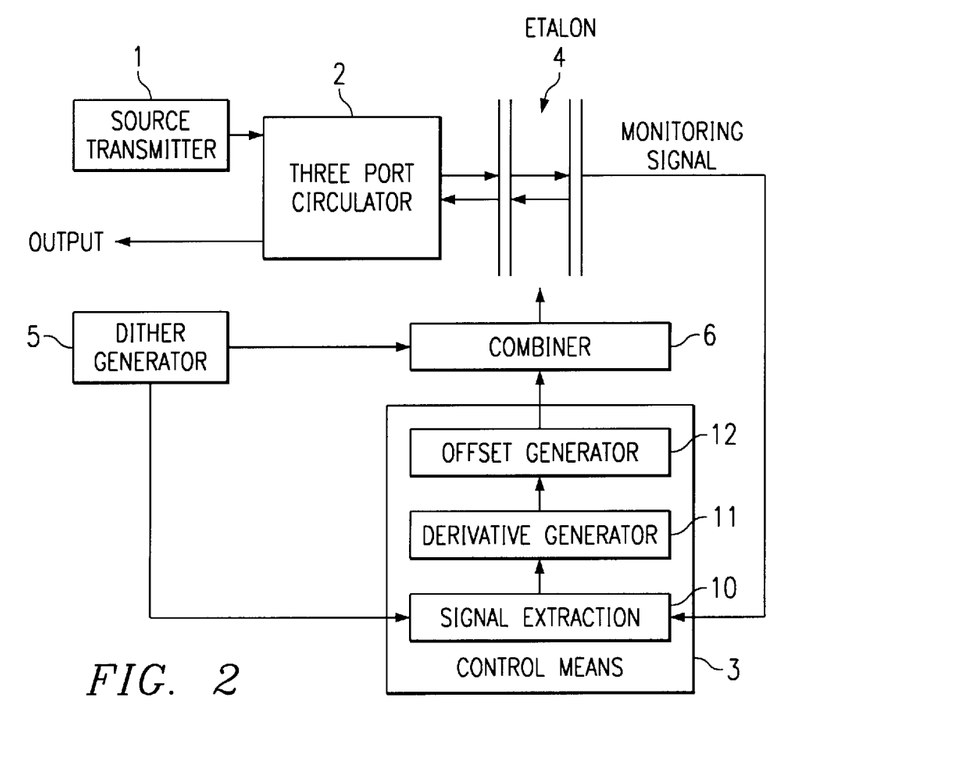
FIG. 2 to 4 show in schematic form alternative implementations of the system of FIG. 1.

FIG. 2 shows one possible implementation of the system of FIG. 1. A dither generator 5 is provided for applying a dither to the response of the etalon 4. Preferably the dither is relatively low frequency, so that the signal extraction from the monitoring signal can be carried out using relatively low speed circuitry which is simpler and cheaper.

The change in response of the etalon can be achieved by changing the spacing of the two reflective surfaces, for example by means of a Piezo-Electric element. The dither signal can be combined with a DC offset signal, as shown by the combiner element 6 in FIG. 2, the output of which is used to control the spacing of the etalon.

The control means 3 as shown in FIG. 2, comprises a signal extraction function 10, which extracts the portion of the monitoring signal which is attributable to the dither signal. This can be done either by narrow band filtering, or by a synchronous detection circuit.

A derivative generator 11 generates a second order derivative with respect to wavelength, and a first order derivative with respect to wavelength from the monitored signal.

By only using derivatives, the system is immune to errors such as those due to detector leakage currents.

From these derivatives, the optimum offset is determined, by means of the offset generator 12, and fed to the etalon. The functions of the signal extraction, generation of the derivatives, and derivation of the offset, can be carried out in a digital signal processor, or by use of conventional analogue circuitry.

Figure 3:
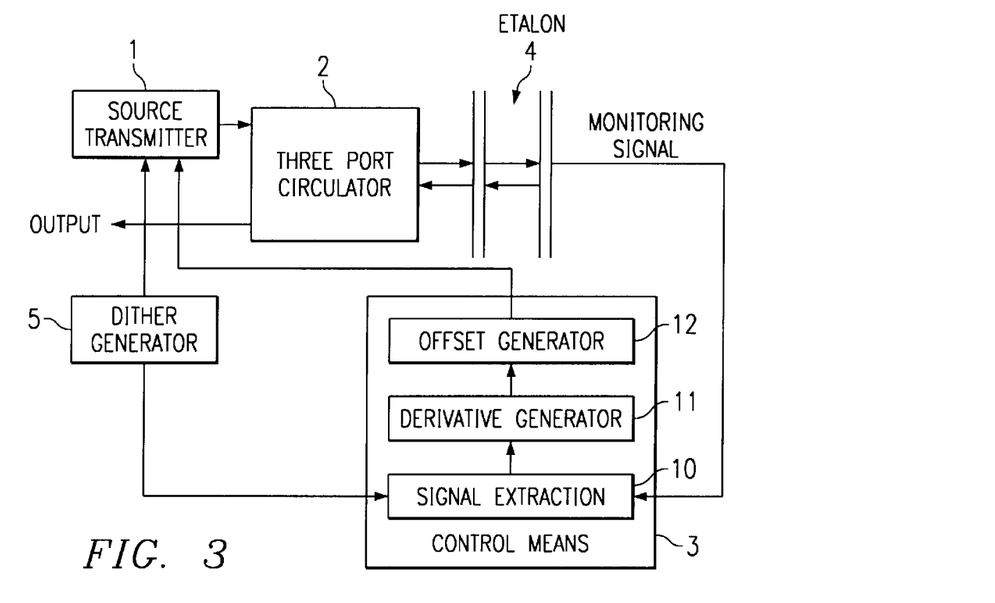

FIG. 3 shows a variation in which the dither is applied to the source transmitter 1. Furthermore, instead of locking the etalon response to the wavelength of the source transmitter, in the embodiment of FIG. 3, the wavelength of the transmitter is locked to that of the etalon resonance. The basic control principles as described in relation to FIG. 2 can be applied in a similar way in FIG. 3. By this means, the etalon can be a stable cavity which is used as a wavelength reference for the laser.

Figure 4:
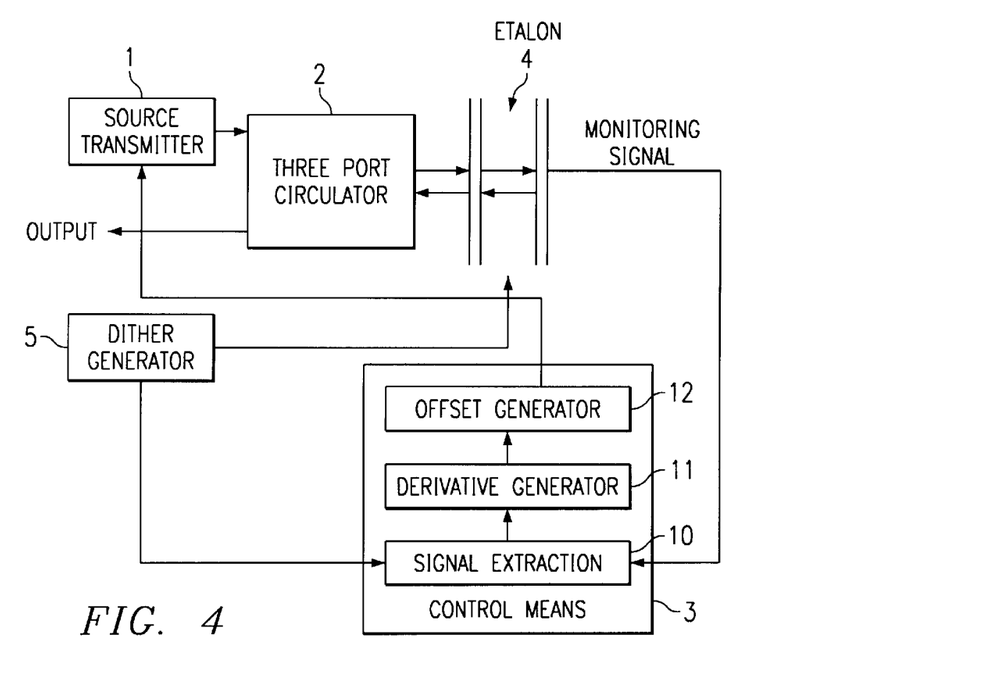

Another alternative is shown in FIG. 4. Here the dither is applied to the etalon, while the offset is applied to the source transmitter 1, to lock it to the etalon response. Again, the basic control principles set out for FIG. 2 can be applied equally to the arrangement of FIG. 4.

The dither is a low frequency signal which enables the etalon to be adjusted for a predetermined amount of detuning, and thus a certain change in monitored power output. This change is also dependent on the etalon response characteristic and on long term changes in monitoring means (photodiode) and Etalon characteristics, and shorter term changes in input power. The dither is one preferred way of obtaining a change in monitored output. In principle low frequencies in the data being transmitted could be used as these can generate frequency dither. The use of the derivatives enables most of the changes to be accounted for, so that the monitored output is dependent only on the etalon response characteristic. This enables the etalon to be controlled to operate at a particular point on its response curve, such that its dispersion remains constant over long periods, as will now be explained with reference to FIGS. 5 to 11.

Figure 5:
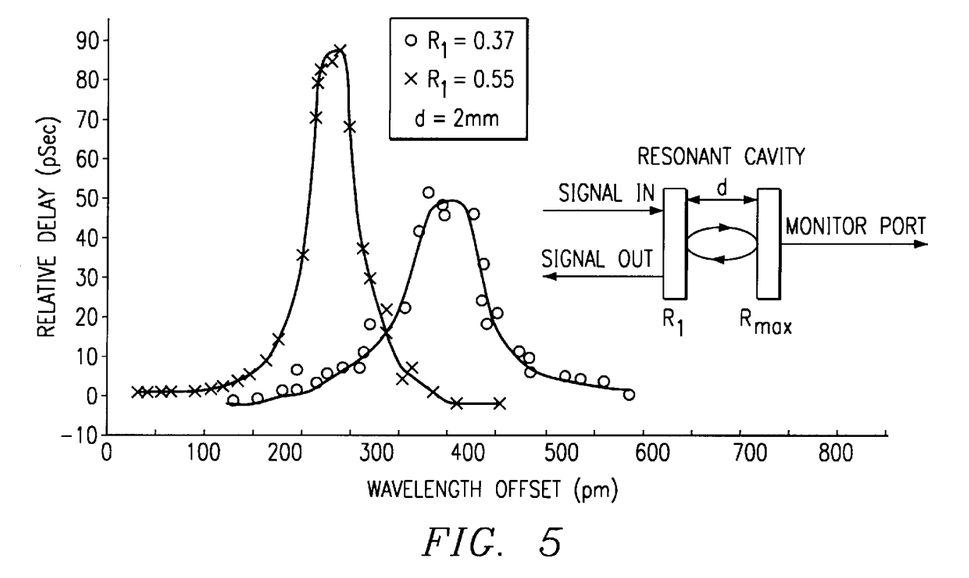
FIG. 5 shows the response of two etalons in terms of delay against wavelength.
Figure 6:
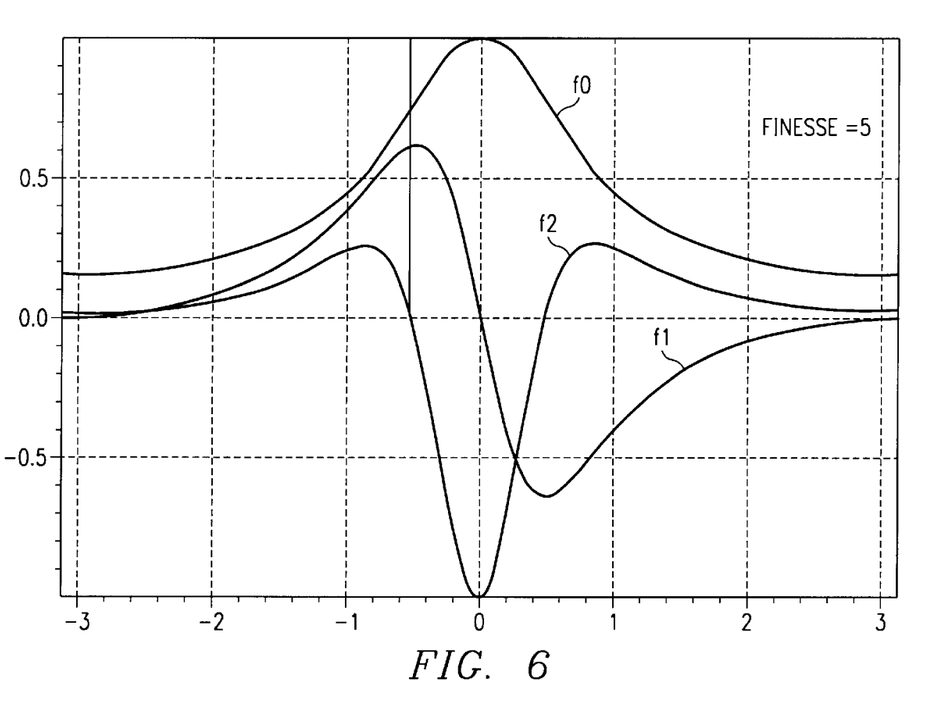
FIGS. 6 to 11 show graphs of wavelength response, and derivatives for etalons of various values of finesse.
Figure 7:
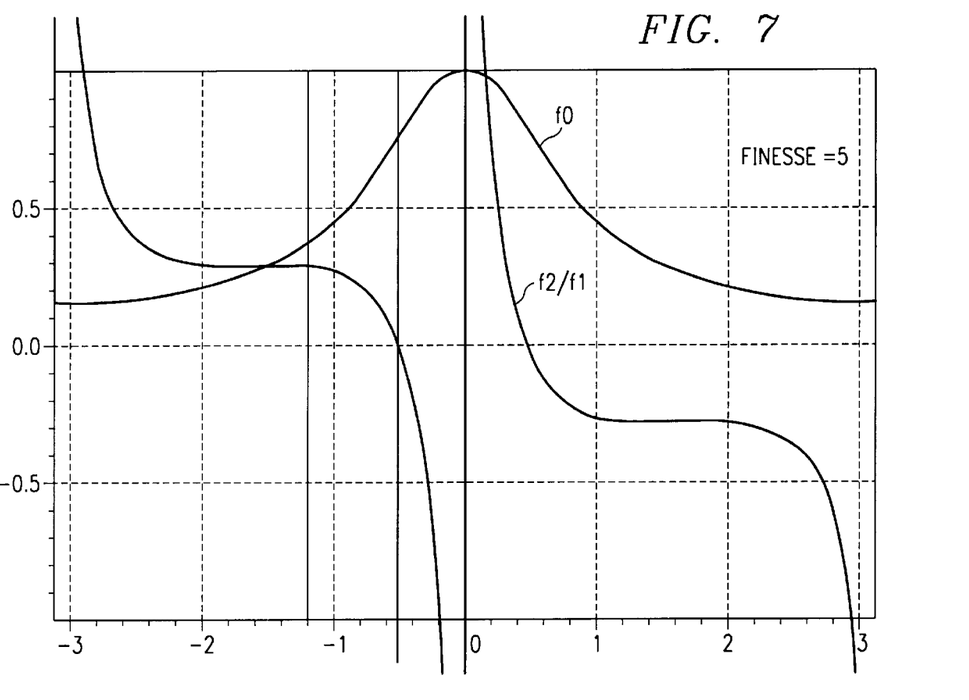
Figure 8:
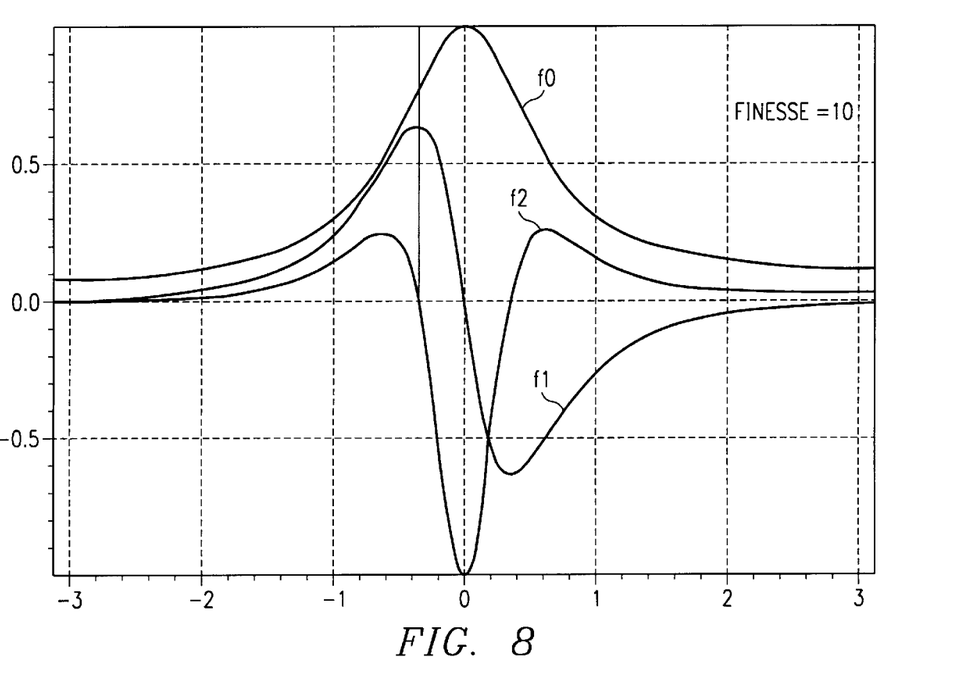
Figure 9:
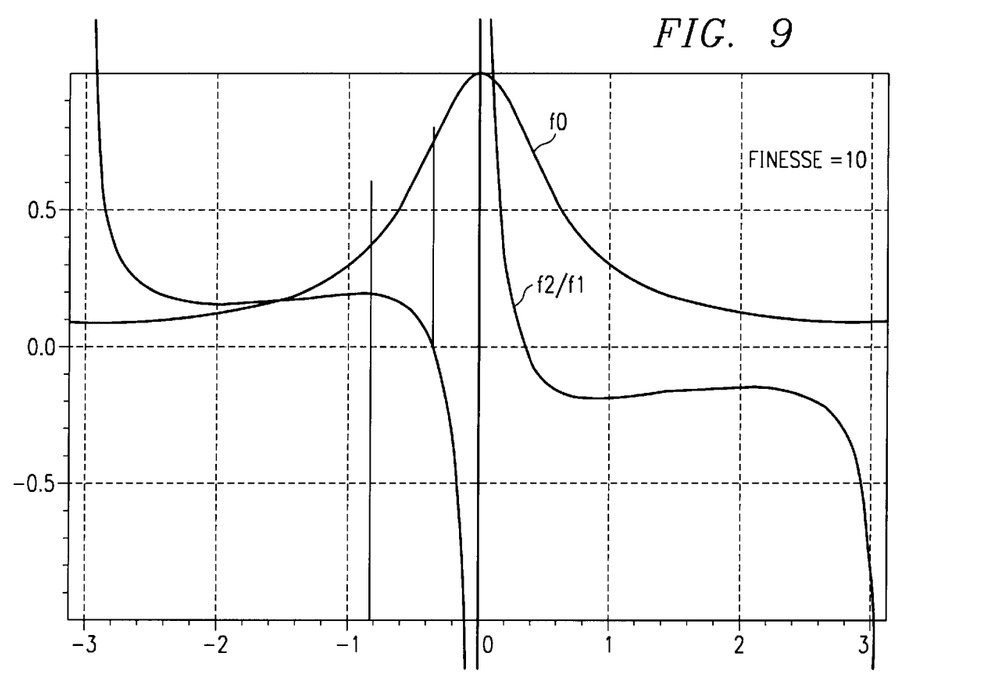
Figure 10:
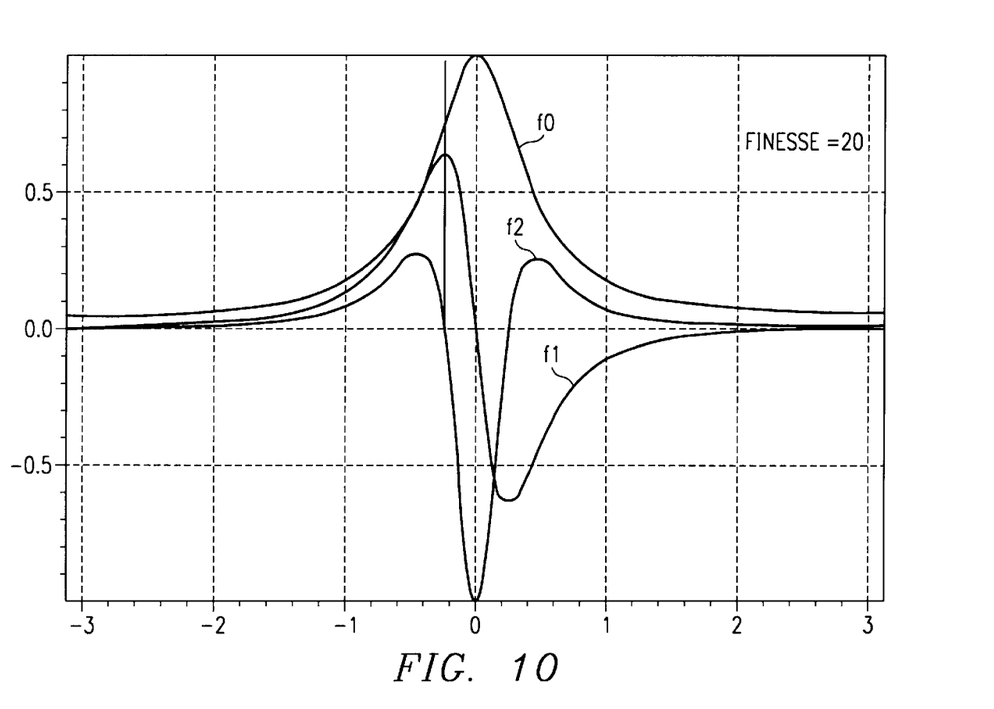

The etalon wavelength response, or transmission characteristic (output power versus detuning in terms of optical wavelength or optical frequency) as given in 'Optics' by Hect 2nd edition on page 367 (the Airy function) is shown in FIG. 5 for two different etalons. FIGS. 6 to 11 also show this response, labelled f0. First and second order derivatives labelled f1 and f2 for an FM dither signal were obtained, with respect to wavelength. All three functions, f0, f1 and f2 were plotted against detuning, in wavelength terms, for different values of the finesse parameter F (F=5,10,20), as shown in FIGS. 6, 8 and 10, respectively. In these figures and FIGS. 7, 9 and 11, the axes are marked with relative dimensions. The first order derivative represents the slope of the response, or delay, and thus represents dispersion directly. The peak of this first order derivative represents the point of maximum dispersion. The second order derivative represents the degree of curvature of the response. Derivative f1 shows a minimum at zero detuning and can't be used to track the etalon on its own as its magnitude varies with optical power. Derivative f2 shows a zero-crossing at 75% transmission, i.e. the point with highest dispersion. Looking at f2 alone would enable control of the etalon to the point with maximum dispersion.

Figure 11:
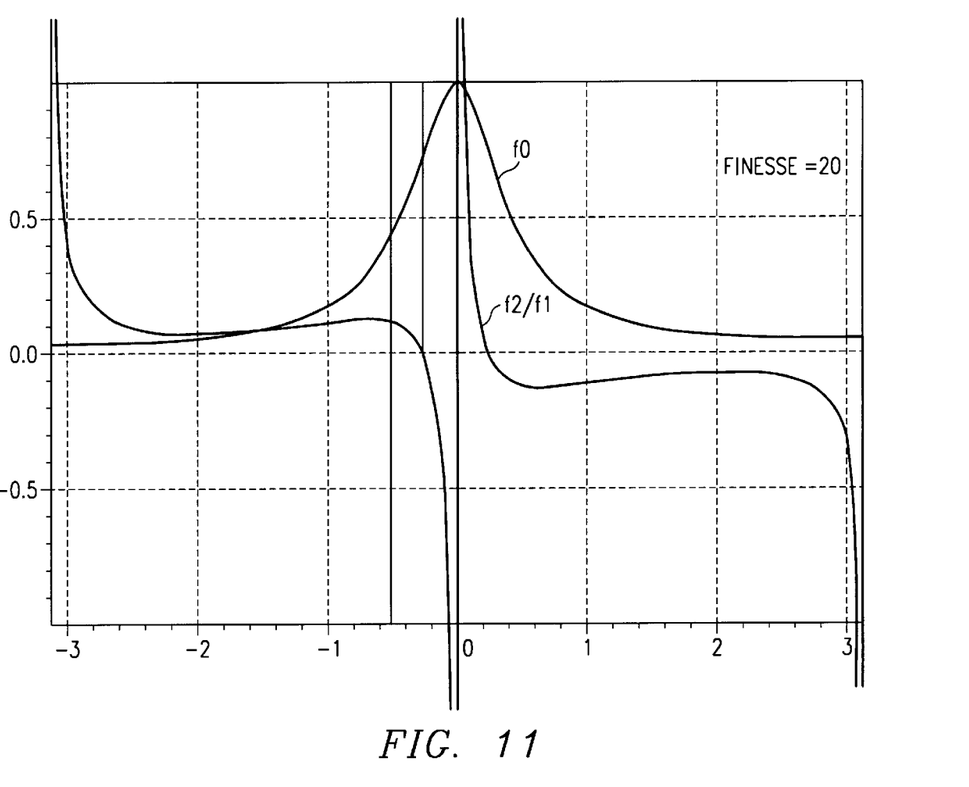

Normalising f2 with f1 yields a signal that is independent of the input power. These ratios are shown in FIGS. 7, 9 and 11 for different values of the finesse parameter (F=5, 10, 20). The ratio still goes through zero at the maximum dispersion point, but it can also be used to track the etalon to any point between 40% and 100% transmission. To control the side of the resonance the etalon will locking to, the polarity of the f1 signal can be used.

Etalon compensators could be applied at the transmitter, the receiver, or even in principle at the line amplifiers. However use at the line amplifiers is not preferred for the following reason. The Fabry-Perot dispersion varies strongly in both magnitude and sign across the bandwidth of the optical amplifier. It can only be locked to provide the correct dispersion for a specific channel. Other channels would have arbitrary dispersion values, depending on their relative wavelength to the "locked" channel.

In principle a multiplicity of etalons could be used, one locked to each channel, but these would require the each channel to be stripped out and reinserted after equalisation, by the use of WDM splitters and combiners. In practice extensive guard bands would be needed to prevent coherent interference between the residual signal on one path, and the main signal on the other. Use of Fabry-Perot compensators at line amplifiers is not compatible with the line amplifier philosophy of transparency.

When located adjacent to the transmitter laser, there is the option of locking the laser to a fixed spacing compensator (instead of tuning the etalon). This has the advantage of eliminating the piezoelectric elements in the etalon, which present significant reliability concerns over life, temperature and humidity. The etalon could also be used as a high stability passive wavelength reference for the laser. The two techniques could in principle be combined.

When a tracking Fabry-Perot compensator is located at the receiver, the monitor signal for the control loop might be acquired from the system receiver or from a separate monitor detector on the monitor port.

A figure of merit for dispersion equalisers may be defined as

FOM=dispersion(ps/nm)/loss (dB).

Group delay measurements can be used directly to calculate the etalon dispersion, bearing in mind that the dispersion as seen by transmitted signal is the averaged value over the signal bandwidth. When averaging over 5 GHz, the dispersion measured for one device was about 1000 ps/nm. Hence, a value of 1000 ps/nm will be used throughout the following calculations of the FOM.

Using an intrinsic loss figure of 0.3 dB for the device, the theoretically achievable FOM with loss-less beam splitter and connectors is 3300 ps/nm/dB, ignoring slight differences between both channels.

The actually measured loss of one channel including circulator (port 1 to 2 and port 2 to 3) and connectors was 4 dB. Hence the FOM for this channel is 250 ps/nm/dB.

The measured total loss of the other channel under the same circumstances as before was 2.5 dB. The FOM therefore is 400 ps/nm/dB.

Wavelength tracking is necessary as the transmission window of the device (~4 GHz) is very narrow. The tracking method of the invention enables the device to be tracked off resonance without depending on the absolute signal power level.

The etalon must be accurately aligned in wavelength with the signal, and a single device can be tuned to align with any wavelength of interest. Using the technique of the invention to lock the etalon to the correct operating point, then a stand-alone solution is feasible. This may be practical using local power monitoring. Integration with the transmitter might enable the piezoelectric actuators to be eliminated. Integration with the receiver would enable the tuning control loop to use eye closure information, and hence provide automatically optimised dispersion compensation.

I claim:

1. A controller for controlling a wavelength response of an etalon arrangement that receives an optical signal, the arrangement comprising a pair of reflecting surfaces arranged substantially parallel to each other, one of the pair of reflecting surfaces being slightly transparent for transmitting a monitoring signal, the controller comprising:
    a derivative generator, coupled to the monitoring signal, for generating a first order and a second order derivative of the monitoring signal; and
    an offset signal generator, coupled to the derivative generator and the etalon arrangement, for generating an offset signal from the first order and second order derivatives, the offset signal adjusting the wavelength response of the etalon arrangement.

2. A control system for controlling a wavelength response of an etalon arrangement that receives an optical signal, the arrangement comprising a pair of reflecting surfaces arranged substantially parallel to each other, one of the pair of reflecting surfaces being slightly transparent for transmitting a monitoring signal, the controller comprising:
    a dither generator that generates a dither signal; and
    a controller comprising:
        a signal extractor, coupled to the monitoring signal and the dither generator, for extracting an output signal comprising a portion of the monitoring signal that is attributable to the dither signal;
        a derivative generator, coupled to the output signal, for generating a first order and a second order derivative of the monitoring signal; and
        an offset signal generator, coupled to the derivative generator and the etalon arrangement, for generating an offset signal from the first order and second order derivatives, the offset signal adjusting the wavelength response of the etalon arrangement.

3. The system of claim 2 wherein the controller adjusts the wavelength response by adjusting spacing between the pair of reflecting surfaces.

4. The system of claim 2 wherein the etalon arrangement is a Fabry Perot etalon dispersion compensator and the controller maintains a constant dispersion of the compensator.

5. An optical transmission system having an output signal with a wavelength, the system comprising:
    a laser that transmits an optical signal;
    an etalon arrangement coupled to the laser, the etalon arrangement comprising a pair of substantially parallel reflective surfaces, one of the pair being slightly transparent to transmit a monitoring signal derived from the optical signal; and
    a control system, coupled to the etalon arrangement and the laser, for generating an offset signal from a ratio of derivatives of the monitoring signal, wherein the offset signal controls the output signal wavelength by adjusting the etalon arrangement.

6. The system of claim 5 wherein the control system further comprises a dither generator, coupled to the laser, for applying a wavelength dither to the laser wherein the ratio of derivatives is obtained from a variation in the monitoring signal caused by the wavelength dither.

7. The system of claim 5 wherein the ratio of derivatives comprises a first order derivative and a second order derivative and the control system maintains, at a predetermined monitoring signal wavelength, a constant ratio of these derivatives.

8. The system claim 7 wherein the control system maintains the second order derivative at zero.

9. The system of claim 5 wherein the control system operates in response to a sign of the first order derivative.

10. An optical transmission system comprising:
a source transmitter for generating an optical signal;
a Fabry Perot etalon dispersion compensator, coupled to the source transmitter, having a wavelength response and an output monitoring signal derived from the optical signal; and
a controller, coupled to the monitoring signal, to control the wavelength response using the monitoring signal such that the dispersion of the compensator is maintained substantially independent of input power variations.

11. A method for transmitting data in an optical transmission system having a source transmitter and an etalon arrangement comprising an output signal, the method comprising the steps of:
monitoring the output signal;
determining a plurality of derivatives in response to the wavelength of the output signal;
calculating a ratio of the plurality of derivatives; and
controlling the wavelength of the output signal in response to the ratio of the plurality of derivatives.

12. A method for controlling an etalon arrangement, the method comprising the steps of:
transmitting an optical signal from a source transmitter to the etalon arrangement comprising a pair of reflecting surfaces arranged substantially in parallel, the etalon arrangement having a wavelength response;
the etalon arrangement generating a monitoring signal in response to the transmitted optical signal;
determining a first plurality of derivatives in response to the monitoring signal;
generating an offset signal in response to the first plurality of derivatives;
dithering the offset signal;
adjusting the wavelength response of the etalon arrangement in response to the dithered offset signal;
determining a second plurality of derivatives from a variation, caused by the dithering of the offset signal; and
adjusting the wavelength response of the etalon arrangement in response to the second plurality of derivatives.

* * * * *